(12) United States Patent
Foster, Sr. et al.

(10) Patent No.: US 8,780,578 B2
(45) Date of Patent: *Jul. 15, 2014

(54) INTEGRATED CIRCUIT DIE STACKS HAVING INITIALLY IDENTICAL DIES PERSONALIZED WITH SWITCHES

(75) Inventors: Jimmy G. Foster, Sr., Morrisville, NC (US); Kyu-Hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

This patent is subject to a terminal disclaimer.

(21) Appl. No.: 13/556,976

(22) Filed: Jul. 24, 2012

(65) Prior Publication Data
US 2012/0286431 A1 Nov. 15, 2012

Related U.S. Application Data

(63) Continuation of application No. 12/617,273, filed on Nov. 12, 2009, now Pat. No. 8,310,841.

(51) Int. Cl.
*H05K 7/02* (2006.01)
*H05K 7/06* (2006.01)
*H05K 7/08* (2006.01)
*H05K 7/10* (2006.01)

(52) U.S. Cl.
USPC ........... 361/783; 361/764; 361/784; 361/790; 361/795; 174/260; 174/262

(58) Field of Classification Search
USPC ......... 361/763–766, 782–784, 792–795, 803; 257/685–690, 723–730
See application file for complete search history.

(56) References Cited

U.S. PATENT DOCUMENTS

| 4,131,516 A | 12/1978 | Bakos et al. |
| 4,733,461 A | 3/1988 | Nakano |

(Continued)

FOREIGN PATENT DOCUMENTS

| EP | 0213205 A1 | 11/1987 |
| EP | 1202296 A1 | 2/2002 |

(Continued)

OTHER PUBLICATIONS

Anonymous; Method for a Cylindrical Chip Capacitor; IP.com Prior Art Database Technical Disclosure; Mar. 16, 2005; pp. 1-10, IP.com.

(Continued)

*Primary Examiner* — Tuan T Dinh
(74) *Attorney, Agent, or Firm* — Edward J. Lenart; Katherine S. Brown; Biggers Kennedy Lenart Spraggins LLP

(57) ABSTRACT

Integrated circuit die stacks having a first die mounted upon a substrate, the first die manufactured to be initially identical to a second die with a plurality of through silicon vias ('TSVs'), the first die personalized by opening switches on the first die, converting the TSVs previously connected through the open switches into pass-through vias ('PTVs'), each PTV implementing a conductive pathway through the first die with no connection to any circuitry on the first die; and the second die, manufactured to be initially identical to the first die and later personalized by opening switches on the second die, the second die mounted upon the first die so that the PTVs in the first die connect signal lines from the substrate through the first die to TSVs in the second die.

15 Claims, 8 Drawing Sheets

(56) References Cited

U.S. PATENT DOCUMENTS

| | | | |
|---|---|---|---|
| 5,298,686 A | 3/1994 | Bourdelaise et al. | |
| 5,452,178 A | 9/1995 | Emesh et al. | |
| 5,839,184 A | 11/1998 | Ho et al. | |
| 5,963,464 A | 10/1999 | Dell et al. | |
| 5,967,799 A | 10/1999 | Arai | |
| 5,998,259 A | 12/1999 | Chuang | |
| 6,194,774 B1 | 2/2001 | Cheon | |
| 6,197,181 B1 | 3/2001 | Chen | |
| 6,208,225 B1 | 3/2001 | Miller | |
| 6,290,833 B1 | 9/2001 | Chen | |
| 6,300,578 B1 | 10/2001 | Hoffmeyer et al. | |
| 6,376,914 B2 | 4/2002 | Kovats et al. | |
| 6,404,001 B2 | 6/2002 | Koo et al. | |
| 6,512,285 B1 | 1/2003 | Hashemi et al. | |
| 6,541,712 B1 | 4/2003 | Gately et al. | |
| 6,621,012 B2 | 9/2003 | Crockett et al. | |
| 6,638,410 B2 | 10/2003 | Chen et al. | |
| 6,646,520 B2 | 11/2003 | Miller | |
| 6,653,170 B1 | 11/2003 | Lin | |
| 6,678,145 B2 | 1/2004 | Naito et al. | |
| 6,680,659 B2 | 1/2004 | Miller | |
| 6,717,071 B2 | 4/2004 | Chang et al. | |
| 6,775,901 B1 | 8/2004 | Lee et al. | |
| 6,803,665 B1 | 10/2004 | Megahed et al. | |
| 6,822,529 B2 | 11/2004 | Miller | |
| 6,853,003 B2 | 2/2005 | Lee | |
| 6,913,471 B2 | 7/2005 | Smith | |
| 6,927,481 B2 | 8/2005 | Gibson et al. | |
| 6,958,547 B2 | 10/2005 | Dubin et al. | |
| 6,983,535 B2 | 1/2006 | Crockett et al. | |
| 7,005,721 B2 | 2/2006 | Nishijima | |
| 7,030,712 B2 | 4/2006 | Brunette et al. | |
| 7,118,985 B2 | 10/2006 | Allman et al. | |
| 7,123,497 B2 | 10/2006 | Matsui et al. | |
| 7,154,356 B2 | 12/2006 | Brunette et al. | |
| 7,186,919 B2 | 3/2007 | Kim et al. | |
| 7,204,648 B2 | 4/2007 | Aronson | |
| 7,227,240 B2 | 6/2007 | Knapp et al. | |
| 7,249,337 B2 | 7/2007 | Gisin et al. | |
| 7,277,005 B2 | 10/2007 | Kang et al. | |
| 7,342,300 B2 | 3/2008 | Wight et al. | |
| 7,916,511 B2 | 3/2011 | Park | |
| 8,064,222 B2 | 11/2011 | Nishio et al. | |
| 8,138,015 B2 * | 3/2012 | Joseph et al. | 438/106 |
| 2002/0191366 A1 | 12/2002 | Naito et al. | |
| 2002/0195271 A1 | 12/2002 | Gailus | |
| 2003/0137042 A1 | 7/2003 | Mess et al. | |
| 2004/0232559 A1 | 11/2004 | Adelmann | |
| 2005/0010725 A1 | 1/2005 | Eilert | |
| 2005/0062556 A1 | 3/2005 | Aronson | |
| 2005/0082664 A1 | 4/2005 | Funaba et al. | |
| 2005/0178669 A1 | 8/2005 | Strubbe | |
| 2005/0184825 A1 | 8/2005 | Oran | |
| 2005/0233501 A1 | 10/2005 | Nose et al. | |
| 2007/0096332 A1 | 5/2007 | Satoh et al. | |
| 2007/0103251 A1 | 5/2007 | Fan et al. | |
| 2007/0117348 A1 | 5/2007 | Ramanathan et al. | |
| 2008/0054428 A1 | 3/2008 | Lam | |
| 2009/0049414 A1 | 2/2009 | Mutnury et al. | |
| 2010/0124035 A1 | 5/2010 | Bandholz et al. | |
| 2011/0073359 A1 | 3/2011 | Cases et al. | |
| 2011/0108972 A1 | 5/2011 | Foster et al. | |
| 2011/0109381 A1 | 5/2011 | Foster, Sr. et al. | |
| 2011/0110064 A1 | 5/2011 | Foster, Sr. et al. | |
| 2011/0110065 A1 | 5/2011 | Foster, Sr. et al. | |
| 2011/0148543 A1 | 6/2011 | Bandholz et al. | |
| 2011/0312129 A1 | 12/2011 | Joseph et al. | |
| 2011/0317387 A1 * | 12/2011 | Pan et al. | 361/782 |
| 2012/0069537 A1 * | 3/2012 | Rofougaran | 361/764 |
| 2012/0162947 A1 * | 6/2012 | O'Donnell et al. | 361/783 |
| 2012/0218024 A1 | 8/2012 | Foster, Sr. et al. | |
| 2012/0299640 A1 | 11/2012 | Foster, Sr. et al. | |
| 2013/0214855 A1 | 8/2013 | Foster, SR. et al. | |

FOREIGN PATENT DOCUMENTS

| | | |
|---|---|---|
| JP | 6140451 A | 5/1994 |
| JP | 2000031651 A | 1/2000 |
| JP | 2008028188 | 2/2008 |
| KR | 20030084355 | 11/2003 |
| WO | WO2004/025695 A2 | 3/2004 |

OTHER PUBLICATIONS

Office Action, U.S. Appl. No. 12/617,169, Feb. 17, 2012, pp. 1-18.
Notice of Allowance, U.S. Appl. No. 12/617,169, Apr. 27, 2012, pp. 1-7.
Office Action, U.S. Appl. No. 12/274,407, May 24, 2011, pp. 1-9.
Notice of Allowance, U.S. Appl. No. 12/274,407, Sep. 29, 2011, pp. 1-12.
Office Action, U.S. Appl. No. 12/570,029, Oct. 20, 2011, pp. 1-9.
Office Action, U.S. Appl. No. 12/570,029, Dec. 15, 2011 pp. 1-11.
Notice of Allowance, U.S. Appl. No. 12/570,029, Apr. 6, 2012, pp. 1-8.
Office Action, U.S. Appl. No. 12/616,912, Feb. 3, 2012, pp. 1-10.
Office Action, U.S. Appl. No. 12/616,912, May 31, 2012, pp. 1-6.
Notice of Allowance, U.S. Appl. No. 12/616,912, Jul. 10, 2012, pp. 1-11.
Office Action, U.S. Appl. No. 12/617,273, Feb. 3, 2012, pp. 1-10.
Office Action, U.S. Appl. No. 12/617,273, May 31, 2012, pp. 1-7.
Notice of Allowance, U.S. Appl. No. 12/617,273, Jul. 9, 2012, pp. 1-10.
Office Action, U.S. Appl. No. 12/644,704, Apr. 3, 2012, pp. 1-6.
Breed, "Analyzing Signals Using the Eye Diagram", Nov. 2005, High Frequency Electronics, vol. 4 No. 11, pp. 50, 52, 53.
Office Action, U.S. Appl. No. 12/616,563, Aug. 6, 2012.
Office Action, U.S. Appl. No. 12/644,704, Aug. 31, 2012.
Notice of Allowance, U.S. Appl. No. 12/617,169, Apr. 27, 2012, pp. 1-07.
Office Action, U.S. Appl. No. 12/274,407, May 24, 2011, pp. 1-09.
Office Action, U.S. Appl. No. 12/570,029, Oct. 20, 2011, pp. 1-09.
Office Action, U.S. Appl. No. 12/570,029, Dec. 15, 2011, pp. 1-11.
Notice of Allowance, U.S. Appl. No. 12/570,029, Apr. 6, 2012, pp. 1-08.
Office Action, U.S. Appl. No. 12/616,912, May 31, 2012, pp. 1-06.
Office Action, U.S. Appl. No. 12/617,273, May 31, 2012, pp. 1-07.
Office Action, U.S. Appl. No. 12/644,704, Apr. 3, 2012, pp. 1-06.
Black et al., "Die Stacking (3D) Microarchitecture", Proceedings of the 39$^{th}$ International Symposium on Microarchitecture, Dec. 2006, pp. 469-479, IEEE Computer Society, Washington, DC, USA.

* cited by examiner

Transmit An Alternating Current Signal From A Substrate Through A First Die Of The Die Stack To Electronic Circuitry In A Second Die Of The Die Stack, The First Die Mounted Directly Upon The Substrate, The First Die Manufactured To Be Identical To The Second Die With A Plurality Of Through Silicon Vias ('TSVs'), The TSVs Connected Through Switches To Electronic Circuitry On Each Die, The First Die Personalized By Opening On The First Die A Number Of The Switches, Converting The TSVs Previously Connected To Open Switches Into Pass-through Vias ('PTVs'), Each PTV Composed Of A Conductive Pathway Through A Die With No Connection To Any Circuitry On The Die, The Second Die Mounted Upon The First Die With No Rotation And No Shift In Position With Respect To The First Die So That PTVs In The First Die Connect Signal Lines From The Substrate Through The First Die To TSVs In The Second Die
302

Conduct, By The Second Die, The Signal Through TSVs In The Second Die To The Electronic Circuitry On The Second Die, The Second Die Manufactured To Be Identical To The First Die And Later Personalized By Opening Switches Connecting TSVs To Circuitry On The Second Die
306

Conduct, By The First Die, The Signal Through PTVs In The First Die To TSVs In The Second Die
304

Conduct The Signal Through An Interface Die Mounted Upon The Substrate Between The Substrate And The First Die, The Interface Die Splitting And Connecting A Same Set Of Signal Lines From The Substrate To The PTVs On The First Die And Separately To TSVs On The First Die
308

Multiplex And Demultiplex By The Interface Die The Same Set Of Signal Lines From The Substrate To The PSVs On The First Die And Separately To TSVs On The First Die, The Signal Lines On The Substrate, To The PTVs, And To The TSVs All Operating At A Same Clock Speed
310

Multiplex And Demultiplex By The Interface Die The Same Set Of Signal Lines From The Substrate To The PTVs On The First Die And Separately To TSVs On The First Die, Including Operating By The Substrate The Signal Lines On The Substrate At A First Clock Speed And Operating By The Interface Die Signal Lines To The PTVs And To The TSVs At A Second Clock Speed, The First Clock Speed Sufficiently Faster Than The Second Clock Speed To Fit Onto The Signal Lines Of The Interface Die All Communications Between The Substrate And The PTVs And The TSVs
312

FIG. 7

Transmit An Alternating Current Signal From A Substrate  302

Transmit The Signal Through A First Substack Of The Die Stack To Electronic Circuitry In A Second Substack Of The Die Stack, The First Die Substack Mounted Upon The Substrate, The First Substack Including Two Or More Dies Manufactured To Be Identical To Dies In A Second Die Substack With A Number Of TSVs, The TSVs Connected Through Switches To A Same Circuit On Each Of The Dies Of The First Substack, The Dies Of The First Substack Personalized By Opening On The Dies Of The First Substack A Number Of Same Switches In Each Die Of The First Substack, Converting The TSVs Previously Connected Through The Open Switches Into PTVs, Each PTV Composed Of A Conductive Pathway Through A Die With No Connection To Any Circuitry On The Die, Each Of The Dies In The First Substack Stacked Directly Upon One Another With No Rotation And No Shift In Position With Respect To One Another
314

Conduct The Signal Through PTVs  304

Conduct, By The First Die Stack, The Signal Through PTVs Of The First Die Stack To TSVs In The Second Die
316

Conduct The Signal Through TSVs To The Electronic Circuitry  306

Conduct The Signals Through TSVs Of The Second Substack To The Electronic Circuitry In The Second Substack, The Second Substack Including Dies Manufactured To Be Identical To The Dies Of The First Substack And Later Personalized By Opening Same Switches In Each Of The Dies Of The Second Substack, Each Of The Dies In The Second Substack Stacked Directly Upon One Another With No Rotation And No Shift In Position With Respect To One Another, The Second Substack Mounted Upon The First Substack So That The PTVs In The First Substack Connect Conductors From The Substrate Through The First Substack To TSVs In The Second Substack
318

FIG. 8

INTEGRATED CIRCUIT DIE STACKS HAVING INITIALLY IDENTICAL DIES PERSONALIZED WITH SWITCHES

CROSS-REFERENCE TO RELATED APPLICATION

This application is a continuation application of and claims priority from U.S. patent application Ser. No. 12/617,273, filed on Nov. 12, 2009.

BACKGROUND OF THE INVENTION

1. Field of the Invention

The field of the invention is design, fabrication, and operation of integrated circuits, or, more specifically, structure and methods of making and operating integrated circuit die stacks having initially identical dies personalized with switches.

2. Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

One of the areas of computer technology that sees continual advancement is packaging of integrated circuits. Packaging many integrated circuits into a confined space is becoming more difficult as many devices continue to shrink in size or need to communicate with more chips. An example would be stacking multiple memory chips in one package to provide more locations to store data. Prior art has shown how to stack multiple chips on top of each other with package stacking, one die per package. Other prior art has shown how to stack multiple dies into one package by tying signal lines together between or among dies within the package, for example, wrapping signal lines outside the dies, or placing redistribution layers between the dies. A more recent approach for wafer stacking is to connect the signals together with vias, effectively sending a bus of signal lines vertically through a stack of dies. All of these approaches have the drawback of more heavily loading busses as more dies are stacked reducing signal quality and bus speeds.

SUMMARY OF THE INVENTION

Integrated circuit die stacks having initially identical dies personalized with switches, methods of making such die stacks, and methods of operating such die stacks, including a first die mounted upon a substrate, the first die manufactured to be initially identical to a second die with a plurality of through silicon vias ('TSVs'), the TSVs connected through switches to electronic circuitry on the first die, the first die personalized by opening on the first die a number of the switches, converting the TSVs previously connected through the open switches into pass-through vias ('PTVs'), each PTV implementing a conductive pathway through the first die with no connection to any circuitry on the first die; and the second die, manufactured to be initially identical to the first die and later personalized by opening switches connecting TSVs to circuitry on the second die, the second die mounted upon the first die so that the PTVs in the first die connect signal lines from the substrate through the first die to TSVs in the second die, each TSV on the second die implementing a conductive pathway through the second die that is also connected to electronic circuitry on the second die.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIGS. 7-8 set forth flow charts illustrating example methods of operation for an integrated circuit die stack according to embodiments of the present invention.

DETAILED DESCRIPTION OF EXEMPLARY EMBODIMENTS

Figure 1:
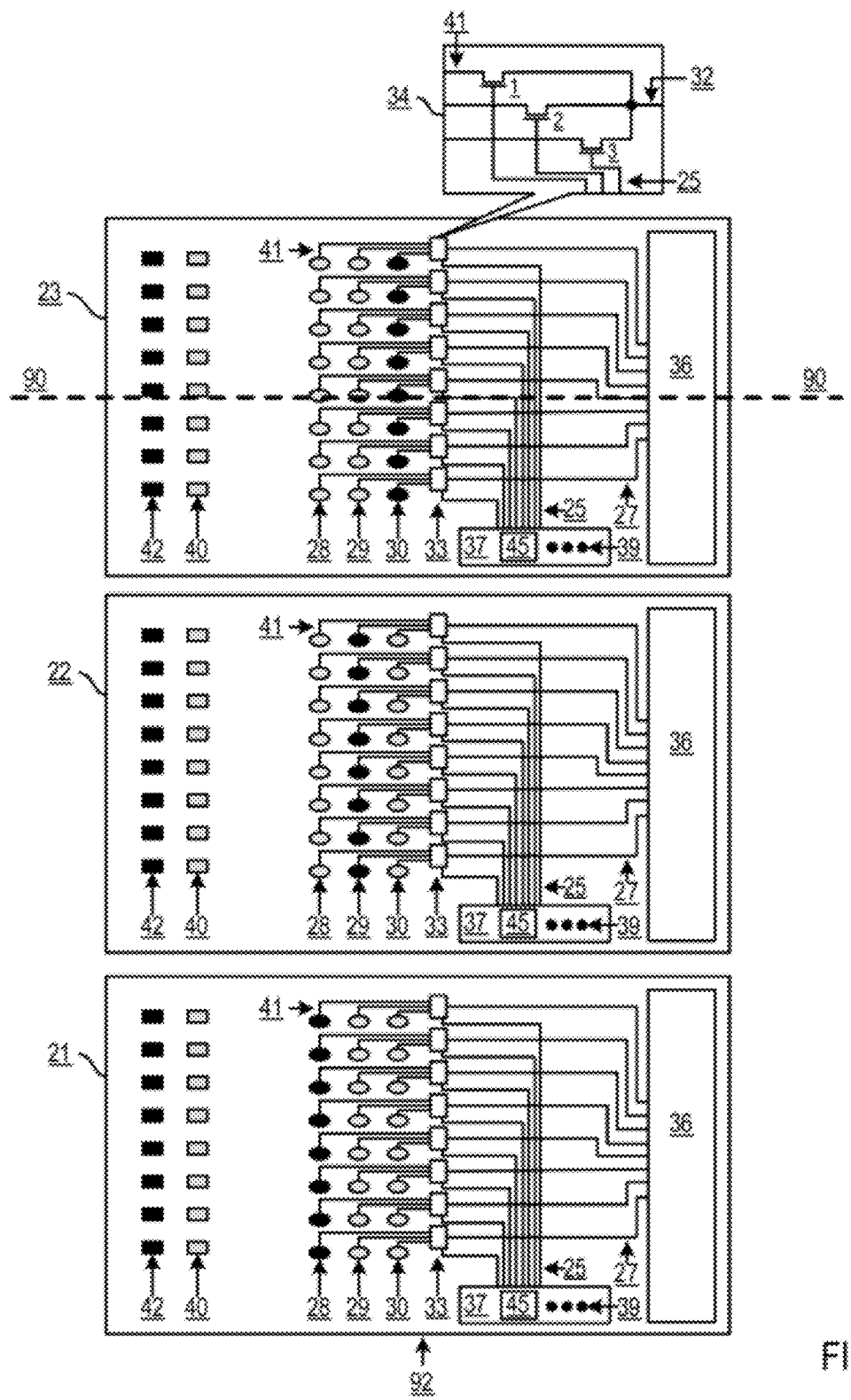
FIG. 1 sets forth a cross-sectional plan view schematic drawing of three example integrated circuit dies of a die stack according to embodiments of the present invention.

Examples of integrated circuit die stacks, methods of manufacturing integrated circuit die stacks, and methods of operation for integrated die stacks according to embodiments of the present invention are described with reference to the accompanying drawings, beginning with FIG. 1. FIG. 1 sets forth a cross-sectional plan view schematic drawing of three example integrated circuit dies (21, 22, 23) of a die stack according to embodiments of the present invention. As an aid to explanation, the dies in the example of FIG. 1 are illustrated unstacked, laid beside one another in the plane of the illustration. A die stack can be formed of these dies by mounting the dies directly upon one another with no rotation and no shift in position with respect to one another, die (22) on die (21) and die (23) on die (22), and then mounting all three dies onto a substrate. The substrate can be a connective layer in a chip package between the die stack and external pins or between flip-chip connectors and the stack. In various embodiments the substrate can be a board, an integrated circuit carrier board, an adapter board, or a motherboard, for example. The substrate can be composed of plastic, phenolic, ceramic, composite, and other materials as may occur to those of skill in the art. The substrate will typically contain disposed within or upon it conductors, electrical buses, for example, including power, common, and signal lines connecting to power, common, signal lines in the dies of a die stack.

Each die (21, 22, 23) in the example of FIG. 1 is manufactured to be initially identical to each of the other dies. "Initially identical" means that each die as manufactured with other dies on a silicon wafer is identical, although the dies are personalized with open switches after initial manufacture. The term 'manufacture' as used here refers to the initial stage of manufacture of a die with other dies on a silicon wafer or the like, rather than the overall process of manufacture in a larger sense. In such a larger sense, 'manufacture' could refer to the process of stacking dies on a substrate, packaging the dies, opening the switches in the dies to create a large integrated circuit in a chip package, on a board, or the like, and so on. But that is not the way the term 'manufacture' is used. Here 'manufacture' refers only the initial stage of fabricating identical dies on a silicon wafer and removing the dies from the wafer—before the dies are personalized in any way. The three dies in the example of FIG. 1 are illustrated as identical in every way, except for the black/gray color indicators for personalized conductive pathways, PTVs and TSVs (28, 29, 30).

Each die in the example of FIG. 1 is initially manufactured with a number of through silicon vias ('TSVs') connected through switches (33) to electronic circuitry on each die (36). The electronic circuitry (36) is the main circuitry for carrying out the processing tasks for which each integrated circuit die is designed, containing many transistors, resistors, capacitors, logic gates, latches and flip-flops, counters, other registers, and so on. Each TSV is a conductive pathway through a die, conductive pathways which when stacked on other dies form conductive pathways vertically through the die stack down to bus conductors in a substrate, connecting bus signals up through the dies in the die stack. Each such vertical conductive pathway (28, 29, 30) through a die is initially manufactured as a TSV, that is, connected (41) to circuitry (36) on the die through switches (33). The fact that the TSVs are connected through the switches means that the switches (33) are manufactured so as to be in their closed, on, or active state as soon as power is applied to the die stack. In this specification, a pass-through via ('PTV') is defined as a conductive pathway, that is, a vertical conductive pathway, through a die not connected to the circuitry on the die. Thus PTVs are distinguished from TSVs which are connected to the electronic circuitry on a die. PTVs in a die connect conductors from a substrate to another die higher in the stack. TSVs in a die connect conductors to circuitry on that die directly from a substrate or from other dies lower in the stack.

The dies (21, 22, 23) in the example of FIG. 1 also include power lines (40) and common lines (42), which like the PTVs and the TSVs are also vertical conductive pathways through the dies. Readers will recognize, although the connections are not shown, that like TSVs, the power and common lines are typically connected to circuitry. In addition, the power lines and common lines, also like TSVs, are initially manufactured disposed on all dies so as to connect conductors, in this case power and common lines, from a substrate up through stacked dies. In the particular example of FIG. 1, with die (22) stacked on die (21), the power lines (40) and the common lines (42) of die (22) align with the power lines (40) and the common lines (42) of die (21), and the power lines (40) and the common lines (42) of die (23) align with the power lines (40) and the common lines (42) of die (22) when die (23) is stacked on die (22). In this way, power and common are conducted from a substrate all the way up through a die stack with no need for any power or common bus connections external to the die stack.

After initial manufacture, each die, initially manufactured as identical to other dies, is personalized by opening one or more of the switches connecting the vertical conductive pathways (28, 29, 30), thereby converting some of the vertical conductive pathways from TSVs into PTVs. For ease of explanation, the term 'switch' is used throughout this specification, but readers of skill in the art will recognize that switches used to personalize an integrated circuit will typically be electronic switches, often a logic gate, a flip-flop, a latch, or some kind of transistor, a bipolar junction transistor, a field effect transistor, or the like. Transistors are commonly used as electronic switches, for both high power applications including switched-mode power supplies and low power applications such as logic gates. Such an electronic switch in its closed or on state represents an electronic connection, and, in its open or off state represents a high resistance, a lack or absence of any electronic connection through the switch. Switches in dies according to embodiments of the present invention are manufactured so that they are initially closed when power is applied to the dies containing the switches and later personalized by opening some of them. As used in this specification, a 'closed' switch is on, active, a connection, and an 'open' switch is off, inactive, representing no electronic connection to anything. A transistor switch or logic gate presents a signal, a voltage or a resistance, on its output the value of which allows a sensing circuit to sense the switch as on or off, open or closed.

Each of the boxes indicated by reference (33) are actually a set of three switches (1, 2, 3) as indicated by the expanded detail in box (34). Each conductor (41) connects one of the vertical conductive pathways (28, 29, 30), TSVs or PTVs, to one of the switches (1, 2, 3). The process of opening the switches is carried out in these example embodiments by switch opening logic (37) installed on the dies themselves, in this example, and connected to the switches by switch opening buses (25). Each switch opening bus (25), shown here in horizontal cross-section as a single line, is actually a three-conductor bus, one conductor for each switch in a set, as shown at reference (25) in the expansion box (34). The switch opening logic, a circuit module, actually present on the dies as shown in this example is not a requirement of the present invention because switch opening apparatus could be provided off the dies, connected to the dies by a peripheral interconnection such as a JTAG or IEEE 1149.1 network, for example. In this example, the switch opening logic in each die is provided with a stack position, information indicating to each die in a stack that die's position in the stack, typically with the position indicated as an integer in the range beginning with '1' for the first die in the stack, that is, the die mounted directly on a substrate, and another integer equal to the total number of identical dies in a stack. The switch opening logic opens a subset of the switches in dependence upon the stack position of the die in which each instance of switch opening logic is installed. The identity of the subset of switches is to be open by the switch opening logic in any particular die is configured into each die at the time of manufacture as data, hardwired or in non-volatile memory, as a switch opening configuration (45). Such a switch opening configuration can be implemented as illustrated, for example, in Table 1.

TABLE 1

Switch Opening Configurations

| Stack Position | Switches To Open |
|---|---|
| 1 | 2, 3 |
| 2 | 1, 3 |
| 3 | 1, 2 |

Each record of Table 1 represents a configuration of switches to be open by switch opening logic in a die in the stack position indicated by values in the left column of the table. Readers will recognize that the table structure is an example data structure used here only for convenient explanation of the association between stack position and indications of switches to open—and not as a limitation of the invention. Such associations of stack position and indications of switches to open can be implemented in a variety of data structures, including, for example, linked lists, arrays, C-style 'structs,' and so on. In all the examples in this specification, stack position 1 is taken as the bottom die in a stack, the die mounted directly on a substrate. According to the switch opening configurations of Table 1, therefore, switch opening logic (37) in a die in stack position 1 is instructed to open switches 2 and 3, therefore converting TSVs at references (29, 30) to PTVs, leaving the conductors at reference (28) TSVs as they were initially manufactured. Similarly, the switch opening configurations of Table 1 instruct switch opening logic (37) in a die in stack position 2 to open switches 1 and 3, therefore converting TSVs at references (28, 30) to PTVs, leaving the conductors at reference (29) TSVs as they were initially manufactured. And the switch opening configurations of Table 1 instruct switch opening logic (37) in a die in stack position 3 to open switches 1 and 2, therefore converting TSVs at references (28, 29) to PTVs, leaving the conductors at reference (30) TSVs as they were initially manufactured. This is actually the pattern illustrated in FIG. 1, with:

- black ovals at reference (28) in die (21) indicating remaining TSVs and the light gray ovals (29, 30) indicating PTVs created by opening switches 2 and 3 on die (21),
- black ovals at reference (29) in die (22) indicating remaining TSVs and the light gray ovals (28, 30) indicating PTVs created by opening switches 1 and 3 on die (22), and
- black ovals at reference (30) in die (23) indicating remaining TSVs and the light gray ovals (28, 29) indicating PTVs created by opening switches 1 and 2 on die (23).

Each instance of switch opening logic in the example of FIG. 1 is also configured with a set of vertical conductors (39), forming a vertical bus among instances of switch opening logic in stacked dies and supporting communications regarding switch opening among a substrate and dies in a stack. Information that can be transmitted up through the vertical bus (39) among instances of switch opening logic includes an instruction to open switches, the stack position of the first die in the stack, and the number of dies in the stack. The instruction to open switches can be delivered directly from automation in a substrate, either when power is first applied to the die stack or every time the die stack is powered on; through a substrate from automation outside the substrate; from peripheral interconnections when a die stack is fabricated; from an operating system of a computer in which a die stack is installed, for example as part of a power-on self test, either when power is first applied to the die stack or every time the computer is powered on; and in other ways as may occur to those of skill in the art. Configuring a die to not need switches opened every time the die is powered on includes configuring the die with non-volatile memory commemorating that the die's switches have already been opened and uninterrupted power to hold the switches in position. Such uninterrupted power can be supplied from a power supply external to the die or from a battery power internal or external to the die. Instructing the die stack to open switches every time the die stack is powered on, although not necessarily preferred, is typically harmless, so long as the desired pattern of switches is opened before commencement of normal die operations.

An example of a method of switch opening is for the switch opening logic, upon receiving an instruction to open switches, to receive also its die's stack position. The switch opening logic can receive a stack position from the substrate or from a die lower in the stack through bus (39) as part of or in conjunction with an instruction to open switches. Then the switch opening logic can carry out a process of opening switches by looking up its switch opening configuration with its stack position in, for example, a structure similar to Table 1, and then opening the switches indicated by the "Switches To Open" column in the table. After the switch opening logic in a in any stack position opens its switches, the switch opening logic increments the stack position and sends the instruction to open switches and the incremented stack position through bus (39) to the switch opening logic in the next higher die in the stack. The switch opening logic in the top die can increment the stack position and transmit the instruction to open switches and the incremented stack position upward through bus (39), despite the fact the instruction to open switches will have no effect when issued from the top die, exercising the algorithm because it must if all the dies are to be manufactured as identical. Alternatively, bus (39), in addition to the instruction to open switches and the stack position, can also carry an indication of the number of dies in the stack, so that the switch opening algorithm in the switch opening logic in each die identically also retrieves its switch opening configuration, opens the switches, compares the stack position to the number of dies in the stack, and transmits information upward only if the value of the current stack position is less than the number of dies in the stack. In this way, the switch opening logic in the top die would not try to transmit anything upward after opening its switches.

This specification just described two switch opening procedures or algorithms, one that operates without knowing the number of dies in the stack and another that operates in dependence upon the number of dies in the stack. A third method of opening switches would be for switch opening logic in each die to increment the stack position before retrieving a switch opening configuration, opening switches, and passing the value of the stack position to the next die in the stack. In such a method, the source of the instruction to open switches and the first value of the stack position is configured to provide to the first die in the stack the initial value of the stack position as '0'. Methods of switch opening that first increment stack position can be adapted to operate with or without the parameter of the number of dies in the stack, so that this specification now discloses four methods of switch opening. It is likely that persons of skill in the art will think of other procedures for opening switches, and all such procedures are well within the scope of the present invention.

Figure 2:
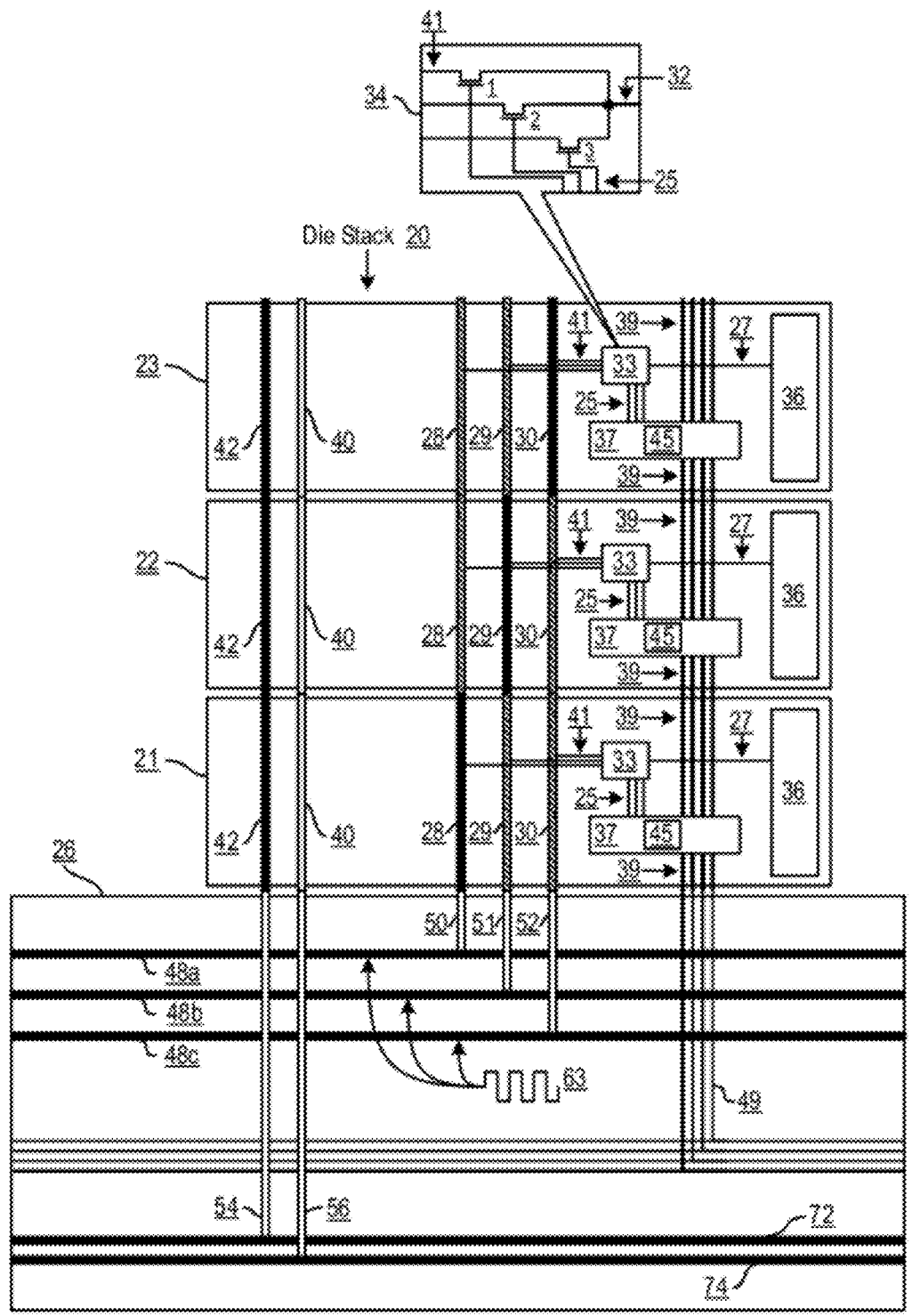
FIGS. 2-5 set forth cross-sectional vertical view schematic drawings of further example integrated circuit die stacks according to embodiments of the present invention.

For further explanation, FIG. 2 sets forth a cross-sectional vertical view schematic drawing of an example integrated circuit die stack (20) according to embodiments of the present invention. FIG. 2 shows the dies (21, 22, 23) of FIG. 1 stacked upon one another and upon a substrate (26)—with the cross-section of FIG. 2 taken along line (90) on FIG. 1 and viewed from perspective (92) on FIG. 1. The substrate includes conductors represented here as signal lines (48*a*, 48*b*, 48*c*), power lines (74), and common lines (72). The signal lines (48*a*, 48*b*, 48*c*), viewed here as a single horizontal line because of the cross-sectional perspective, in fact represent a plurality of bus conductors, eight (to match the number of TSVs in the dies of FIG. 1), or, alternatively, sixteen, thirty-two, sixty-four, and so on. Each die in this example includes PTVs shown as cross hatched vertical bars at references (29, 30) on die (21), (28, 30) on die (22), (28, 29) on die (23), vertical conductive pathways through a die with no connections to any circuitry on the die. Each die also includes TSVs shown as solid black vertical bars at references (28) on die (21), (29) on die (22), (30) on die (23), again, conductive pathways through a die that also connect to electronic circuitry (36) on a die. The substrate (26) provides connections (50, 51, 52) from the signal lines (48*a*, 48*b*, 48*c*) in the substrate through TSVs to circuitry (36) on the dies. In addition, the substrate's signal lines connect to the TSVs (29) in the second die (22) through PTVs (29) in the first die (21), and the substrate's signal lines also connect to the TSVs (30) in the third die (23) through PTVs (30) in the first die (21) and the second die (22). As mentioned, the substrate (26) can be a connective layer in a chip package between the die stack and external pins or between flip-chip connectors and the stack. In various embodiments the substrate can be a board, an integrated circuit carrier board, an adapter board, or a motherboard, for example. The substrate can be composed of plastic, phenolic, ceramic, composite, and other materials as may occur to those of skill in the art. The substrate will typically contain disposed within or upon it conductors, electrical buses, for example, including power, common, and signal lines connecting to power, common, signal lines in the dies of a die stack.

Each die (21, 22, 23) in the example of FIG. 2 is manufactured to be initially identical to each of the other dies, and the three dies in the example of FIG. 2 are illustrated as identical in every way, except for the black/cross hatched color indicators for personalized conductive pathways, PTVs and TSVs (28, 29, 30). Each die in the example of FIG. 1 is initially manufactured with a number of TSVs connected through switches (33) to electronic circuitry on each die (36). Each vertical conductive pathway (28, 29, 30) through a die is initially manufactured as a TSV, that is, connected (41) to circuitry (36) on the die through switches (33).

The dies (21, 22, 23) in the example of FIG. 2 also include power lines (40) and common lines (42), which like the PTVs and the TSVs are also vertical conductive pathways through the dies. The power lines and common lines are manufactured disposed on all dies so as to connect conductors, in this case power and common lines from a substrate, up through stacked dies. In the particular example of FIG. 2, with die (22) stacked on die (21), the power lines (40) and the common lines (42) of die (22) align with the power lines (40) and the common lines (42) of die (21), and the power lines (40) and the common lines (42) of die (23) align with the power lines (40) and the common lines (42) of die (22) when die (23) is stacked on die (22). In this way, power (74) and common (72) are conducted (54, 56) from a substrate (26) all the way up through a die stack (20) with no need for any power or common bus connections external to the die stack.

After initial manufacture, each die, initially manufactured as identical to other dies, is personalized by opening one or more of the switches connecting the vertical conductive pathways (28, 29, 30), thereby converting some of the vertical conductive pathways from TSVs into PTVs. Each of the boxes indicated by reference (33) are actually a set of three switches (1, 2, 3) as indicated by the expanded detail in box (34). Each conductor (41) connects one of the vertical conductive pathways (28, 29, 30), TSVs or PTVs, to one of the switches (1, 2, 3). The process of opening the switches is carried out in these example embodiments by switch opening logic (37), a circuit module installed on the dies themselves, in this example, and connected to the switches by a switch opening bus (25). In this example, the switch opening logic in each die is provided with a stack position, information indicating to each die in a stack that die's position in the stack, typically with the position indicated as an integer in the range beginning with '1' for the first die in the stack, that is, the die mounted directly on a substrate, and another integer equal to the total number of identical dies in a stack. The switch opening logic opens a subset of switches in dependence upon the stack position of the die in which each instance of switch opening logic is installed. Which subset of switches is to be open by the switch opening logic in any particular die is configured into each die at the time of manufacture as data, hardwired or in non-volatile memory, as a switch opening configuration (45). Such a switch opening configuration can be implemented as illustrated, for example, in Table 1 above.

As described above, each record of Table 1 represents a configuration of switches to be open by switch opening logic in a die in the stack position indicated by values in the left column of the table. According to the switch opening configurations of Table 1, switch opening logic (37) in a die in stack position 1 is instructed to open switches 2 and 3, therefore converting TSVs at references (29, 30) to PTVs, leaving the conductors at reference (28) TSVs as they were initially manufactured. Similarly, the switch opening configurations of Table 1 instruct switch opening logic (37) in a die in stack position 2 to open switches 1 and 3, therefore converting TSVs at references (28, 30) to PTVs, leaving the conductors at reference (29) TSVs as they were initially manufactured. And the switch opening configurations of Table 1 instruct switch opening logic (37) in a die in stack position 3 to open switches 1 and 2, therefore converting TSVs at references (28, 29) to PTVs, leaving the conductors at reference (30) TSVs as they were initially manufactured. This is actually the pattern illustrated in FIG. 2, with:

a black bar at reference (28) in die (21) indicating remaining TSVs and the cross-hatched bars (29, 30) indicating PTVs created by opening switches 2 and 3 on die (21), a black bar at reference (29) in die (22) indicating remaining TSVs and the cross-hatched bars (28, 30) indicating PTVs created by opening switches 1 and 3 on die (22), and a black bar at reference (30) in die (23) indicating remaining TSVs and the cross-hatched bars (28, 29) indicating PTVs created by opening switches 1 and 2 on die (23).

Each instance of switch opening logic in the example of FIG. 2 is also configured with a set of vertical conductors (39), forming a vertical bus among instances of switch opening logic in stacked dies, and supporting communications regarding switch opening among a substrate and dies in a stack. The substrate (26) in this example is configured with a switch opening control bus (49) connected to the in-die bus (39) to communicate information regarding switch opening. Information regarding switch opening that can be transmitted up through the vertical bus (39) among instances of switch opening logic includes an instruction to open switches, the stack position of the first die in the stack, and the number of dies in the stack. As noted earlier, the instruction to open switches can be delivered directly from automation in a substrate, through a substrate from automation outside the substrate, from peripheral interconnections when a die stack is fabricated, from an operating system of a computer in which a die stack is installed, and in other ways as may occur to those of skill in the art. In addition, this specification describes above with regard to FIG. 1 four methods of opening switches when switch opening logic receives an instruction to do so and noted that all such methods of switch opening, as well as others that may occur to persons of skill in the art, are well within the scope of the present invention.

Figure 3:
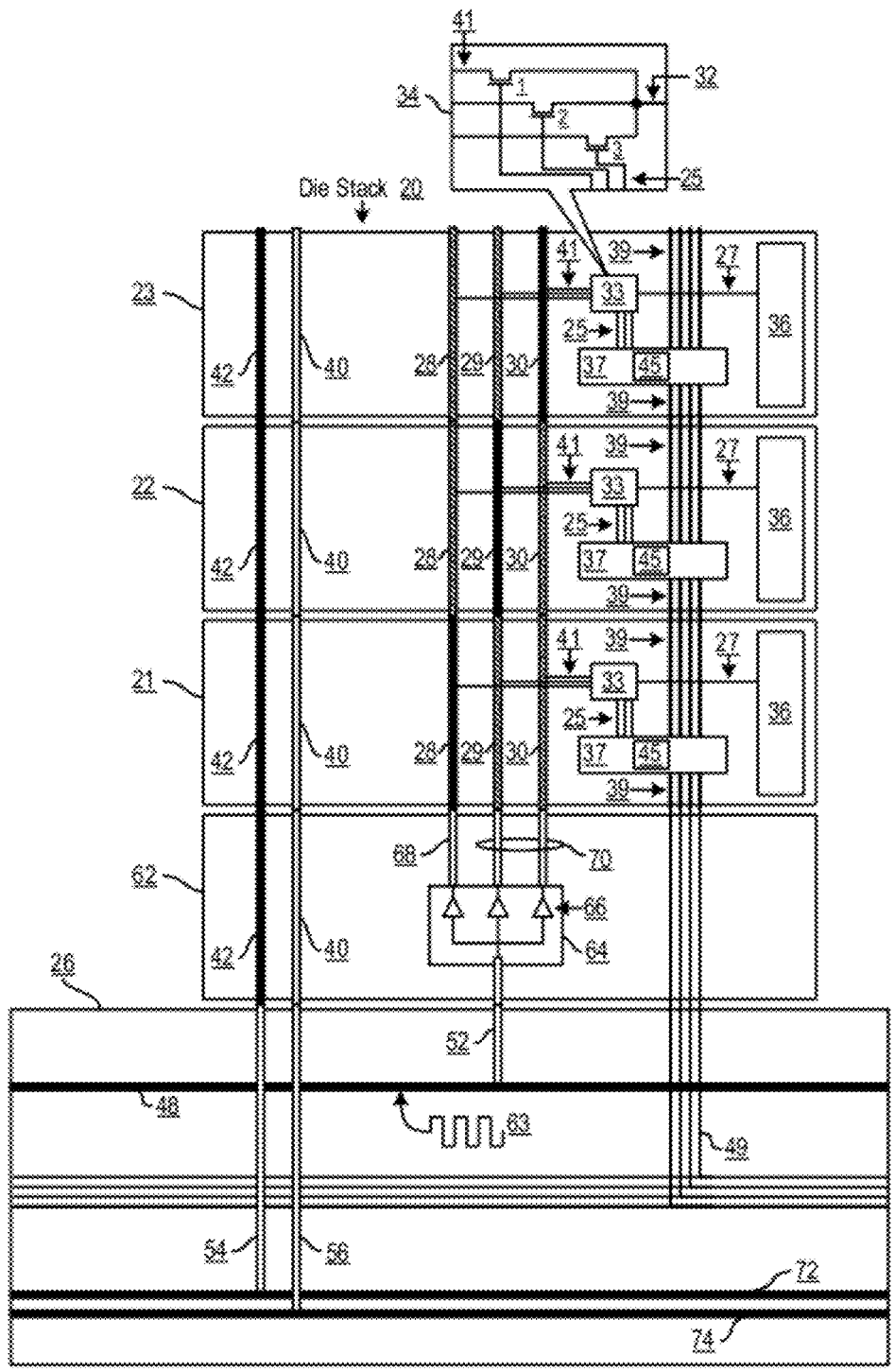

For further explanation, FIG. 3 sets forth a cross-sectional vertical view schematic drawing of a further example integrated circuit die stack according to embodiments of the present invention, where the die stack (20) includes an interface die (62). FIG. 3 shows the dies (21, 22, 23) of FIGS. 1-2 stacked upon a substrate (26) similar to the substrate (26) of FIG. 2—with the cross-section of FIG. 3 taken along line (90) on FIG. 1 and viewed from perspective (92) on FIG. 1. The example die stack of FIG. 3, however, unlike the die stack of FIG. 2, includes an additional die, an interface die (62) mounted upon the substrate (26) between the substrate (26) and the first die (21).

The interface die (62) provides an interface between the other dies (21, 22, 23) in the stack (20) in the sense that the interface die splits and connects a same set of signal lines (48) from the substrate to the PTVs (29, 30) on the first die (21) in the stack and separately to TSVs (28) on the first die (21). PTVs (29) on the first die (21) then convey signals from the substrate through TSVs (29) of the second die (22) to circuitry (36) on the second die (22)—and PTVs (30) on the first die (21) convey signals from the substrate through PTVs (30) of the second die (22) and through TSVs (30) of the third die (23) to circuitry (36) on the third die (23). The splitting of signals in the interface die (62) is effected by interface circuitry (64) in the interface die (62). The interface circuitry includes drivers (66) that connect the signal lines (48) from the substrate to signal lines (68, 70) in the interface die. The drivers (66) are depicted pointing up through the stack in a unidirectional manner, but readers will recognize that the interface circuitry (64) can be configured to operate the conductors (52, 68, 70) either unidirectionally or bidirectionally. The signal lines (68) connect driver outputs to TSVs (28) in the first die (21) and therefore through switches (33) to electronic circuitry (36) in the first die, and the signal lines (70) connect driver outputs to PTVs (29, 30) in the first die (21) and therefore to TSVs (29) and circuitry (36) in the second die (22), and through PTVs (30) in the second die (22) to TSVs (30) and circuitry (36) in the third die (23). The drivers (66) are depicted pointing up through the stack in a unidirectional manner, but readers will recognize that the interface circuitry (64) can be configured to operate the conductors (52, 68, 70) either unidirectionally or bidirectionally.

In view of this explanation of the example die stack of FIG. 3, readers will note that the substrate (26) of FIG. 3, unlike the substrate (26) under the die stack of FIG. 2, with the inclusion of the interface circuitry (64) of the interface die in the die stack, has only one signal bus (48) and drives only a single bus connection (52) into the die stack despite the fact that three signal buses rise through the three dies (21, 22, 23) in the stack. This is a design and manufacturing advantage over the substrate of FIG. 2 which drives three signal buses into the die stack from three separate signal buses (48a, 48b, 48c) in the substrate, one set of bus lines into the TSVs (28) of die (21), another set of bus lines into the PTVs (29) of die (21), and a third set of bus lines into the PTVs (30) of die (21). This is an engineering tradeoff, the cost of adding an interface die to the stack against the cost of manufacturing a more complex substrate. It is likely that embodiments with more sets of PTVs and TSVs and therefore more buses driven into the die stack will tend to prefer the use of an interface die.

Figure 4:
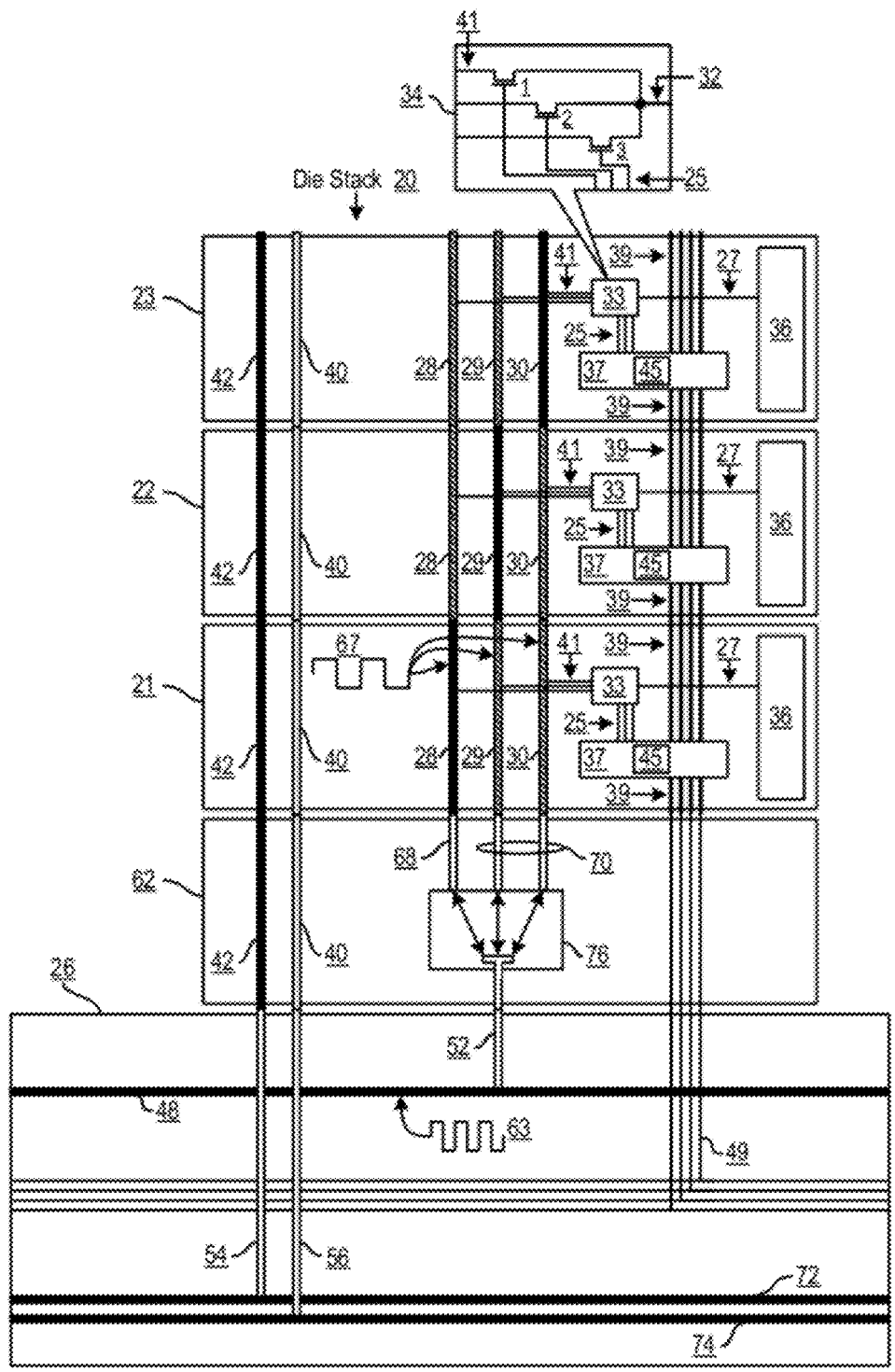

For further explanation, FIG. 4 sets forth a cross-sectional vertical view schematic drawing of a further example integrated circuit die stack according to embodiments of the present invention, where the die stack (20) includes an interface die (62). FIG. 4 shows the dies (21, 22, 23) of FIGS. 1-2 stacked upon a substrate (26) like the substrate (26) of FIG. 3—with only one signal bus (48) in the substrate—with the cross-section of FIG. 4 taken along line (90) on FIG. 1 and viewed from perspective (92) on FIG. 1. The example die stack of FIG. 4, also like the die stack of FIG. 3, includes an interface die (62) mounted upon the substrate (26) between the substrate (26) and the first die (21) in the die stack (20).

The interface die (62) in the example of FIG. 4 provides an interface between the other dies (21, 22, 23) in the stack in the sense that the interface die multiplexes and demultiplexes the same set of signal lines (48) from the substrate (26) to the PTVs (29, 30) on the first die (21) and separately to TSVs (28) on the first die (21). PTVs (29) on the first die (21) then convey signals from the substrate through TSVs (29) of the second die (22) to circuitry (36) on the second die (22)—and PTVs (30) on the first die (21) convey signals from the substrate through PTVs (30) of the second die (22) and through TSVs (30) of the third die (23) to circuitry (36) on the third die (23). The multiplexing and demultiplexing of signals in the interface die (62) is carried out by mux/demux circuitry (76) in the interface die (62). The mux/demux circuitry (76) connects the signal lines (48) from the substrate to signal lines (68, 70) in the interface die. The signal lines (68) connect driver outputs to TSVs (28) in the first die (21) and therefore through switches (33) to electronic circuitry (36) in the first die, and the signal lines (70) connect driver outputs to PTVs (29, 30) in the first die (21) and therefore to TSVs (29) and circuitry (36) in the second die (22), and through PTVs (30) in the second die (22) to TSVs (30) and circuitry (36) in the third die (23).

Alternating current signals on the signal lines (48, 52, 68, 70) are typically characterized by a clock speed. The interface die (62) can optionally operate the signal lines (68, 70) to the PTVs (29, 30) and the TSVs (28) in the first die (21) at the same clock speed as the signal lines (48) in the substrate—although such a design would potentially leave the identical dies (21, 22, 23) operating with unused data communications bandwidth. As a possibly preferred alternative, therefore, the substrate can be configured to operate the signal lines (48) of the substrate at a first clock speed (63) with the interface die (62) operating signal lines (68, 70) to the PTVs and the TSVs at a second clock speed (67), the first clock speed sufficiently faster than the second clock speed to fit onto the signal lines (68, 70) of the interface die all communications between the substrate and the PTVs and the TSVs. In a case where, for example, the clock speed of the signal lines (48) in the substrate (26) were 1.5 GHz and the clock speed of the signals on the signal lines (68, 70) in the interface die (62) were 0.5 GHz—and the mux/demux circuitry (76) administers packets of data from the substrate, sending one third of the packets to each die (21, 22, 23) for processing—then with these two example clock speeds, data communications from the substrate to the dies would exactly fit the bandwidth of the data communications speed available between the interface die and the other dies in the stack, thereby reducing or eliminating completely any need for buffering in the mux/demux circuitry (76) or elsewhere in the interface die (62)—and also eliminating any need to increase bandwidth in the substrate by adding additional signal bus lines, like (48b, 48c) on FIG. 2.

Figure 5:
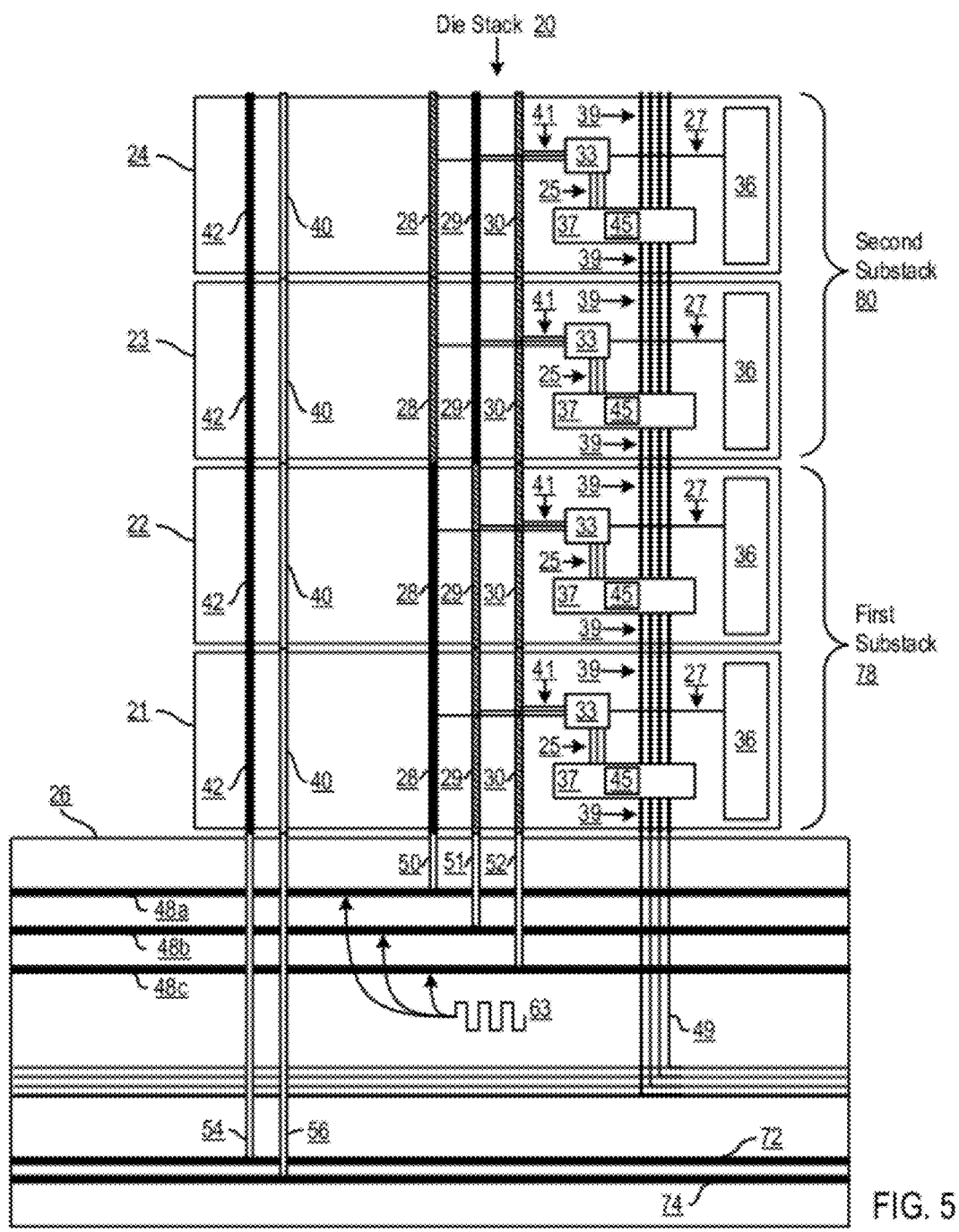

For further explanation, FIG. 5 sets forth a cross-sectional vertical view schematic drawing of a further example integrated circuit die stack (20) according to embodiments of the present invention, where the die stack (20) includes substacks (78, 80). FIG. 5 shows dies like the dies (21, 22, 23) of FIG. 1, manufactured to be initially identical to one another and to dies in other substacks, stacked upon a substrate (26) like the substrate (26) of FIG. 2—with the cross-section of FIG. 5 taken along line (90) on FIG. 1 and viewed from perspective (92) on FIG. 1. In the example die stack of FIG. 5, however, the stacked dies are organized as two substacks, including a first substack (78) mounted upon the substrate (26), with the first substack including two or more (in this example, only two) identical dies (21, 22), identical not only in original manufacture but also identical in their pattern of open switches and therefore identical in the structure of their PTVs (29, 30) and TSVs (28). It is the same switches open in each die of a substack that defines a substack, distinguishing one substack from another substack because the dies in the other substack have a same pattern of open switches that is different from the pattern of switches open in the first substack. In the particular example of FIG. 5, the first die substack (78) is mounted directly upon the substrate (26), and the first substack includes TSVs (28) connected through switches (33) to electronic circuitry (36) on each of the dies (21, 22) of the first substack. The dies (21, 22) of the first substack are personalized by opening on the dies of the first substack a number of the same switches in each die of the first substack, converting TSVs previously connected through the open switches into PTVs (29, 30), so that the PTVs (29, 30) in the dies (21, 22) of the first substack represent conductive pathways through the dies of the first substack with no connections to any circuitry in the dies of the first substack. The dies of the first substack are stacked directly upon one another, that is, die (22) is stacked upon die (21), with no rotation and no shift in position with respect to one another.

The example die stack (20) of FIG. 5 also includes a second substack (80) that includes two or more dies (in this example, exactly two) (23, 24) manufactured to the initially identical to one another and also initially identical to the dies (21, 22) in the first substack (78). The dies of the second substack are stacked directly upon one another, that is, die (24) is stacked upon die (23), with no rotation and no shift in position with respect to one another. In addition, the dies of the second substack are completely identical to one another, identical not only in original manufacture but also identical in their pattern of open switches and therefore identical in the structure of their PTVs (28, 30) and TSVs (29). That is, the dies (22, 24) of the second substack are personalized by opening on the dies of the second substack a number of the same switches in each die of the second substack, converting TSVs previously connected through the open switches into PTVs (28, 30), so that the PTVs (28, 30) in the dies (23, 24) of the second substack represent conductive pathways through the dies of the second substack with no connections to any circuitry in the dies of the second substack.

The entire second substack (80) is mounted upon the first substack (78) so that PTVs (29) in the first substack connect the signal lines (48b, 51) from the substrate (26) through the first substack (78) to TSVs (29) in the second substack (80), where the TSVs (29) in the second substack (80) drive active circuitry (36) in the dies (23, 24) of the second substack (80). Readers will recognize also that PTVs (30) in the first substack (78) connect conductors, that is, signal lines (48c, 52), to PTVs (30) in the second substack (80), through which signals could be conducted to a TSVs and circuitry in a third substack—if a designer or manufacturer were to install a third substack on top of the second substack (80). Similarly, identical dies with more than two sets of PTVs can support installation of even more substacks, enabling creation of integrated circuit stacks in integrated circuit packages with various bus structures through the die stacks, with no need to use external wiring to connect buses up through the dies stacks, with die stacks fabricated with completely identical dies fabricated on wafers of many, many identical dies—and later personalized with open switches according to embodiments of the present invention.

The process of opening switches in die stacks with substacks differs somewhat from the process of opening switches in die stacks without substacks in that the process of opening switches in die stacks with substacks uses the parameters of substack size and substack die position. The process of opening the switches in substacks, like switch opening without substacks, is still carried out in these example embodiments by switch opening logic (37) installed on the dies themselves and connected to the switches (33) by switch opening buses (25).

The switch opening logic in each die, however, is provided with a substack position, information indicating to each die in a substack that die's substack position in the overall die stack, typically with the substack position indicated as an integer in the range beginning with '1' for the first substack in the die stack, that is, the substack mounted directly on a substrate, and another integer equal to the total number of identical dies in each substack. The switch opening logic opens a same subset of switches in each die in a substack—in dependence upon the substack position of each instance of switch opening logic. Which subset of switches is to be open by the switch opening logic in any particular substack is configured into each die at the time of manufacture as data, hardwired or in non-volatile memory, as a switch opening configuration (45). Such a switch opening configuration can be implemented for the case of dies stacks with substacks as illustrated, for example, in Table 2.

TABLE 2

| Switch opening configurations | |
|---|---|
| Substack Position | Switches To Open |
| 1 | 2, 3 |
| 2 | 1, 3 |
| 3 | 1, 2 |

Each record of Table 2 represents a configuration of switches to be open by switch opening logic in a die in the substack position indicated by values in the left column of the table. According to the switch opening configurations of Table 2, switch opening logic (37) in the dies in substack position 1 is instructed to open switches 2 and 3 in each of the dies in the substack, therefore converting TSVs at references (29, 30) to PTVs, leaving the conductors at reference (28) TSVs as they were initially manufactured. Similarly, the switch opening configurations of Table 2 instruct switch opening logic (37) in dies in stack position 2 to open switches 1 and 3, therefore converting TSVs at references (28, 30) to PTVs, leaving the conductors at reference (29) TSVs as they were initially manufactured. For ease of explanation, the example of FIG. 5 is illustrated with only two substack, but the switch opening configuration of Table 2 is the actual pattern illustrated in FIG. 1, with:

- black bars at reference (28) in the dies (21, 22) of the substack (78) in substack position 1 indicating remaining TSVs and the cross-hatched bars (29, 30) indicating PTVs created by opening switches 2 and 3 on each of the dies (21, 22) in the substack (78) in substack position 1, and
- black bars at reference (29) in the dies (23, 24) of the substack (80) in substack position 2 indicating remaining TSVs and the cross-hatched bars (28, 30) indicating PTVs created by opening switches 1 and 3 on each of the dies (23, 24) in the substack (80) in substack position 2.

Each instance of switch opening logic in the example of FIG. 5 is also configured with a set of vertical conductors (39), forming a vertical bus among instances of switch opening logic in stacked dies, and supporting communications regarding switch opening among a substrate and dies in a stack. Information that can be transmitted up through the vertical bus (39) among instances of switch opening logic in substacks includes an instruction to open switches, the substack position of the first die in the stack, and the number of dies in the substacks.

An example of a method of switch opening in substacks is for the switch opening logic (37), upon receiving an instruction to open switches, to receive also its substack position, its die's position in its substack, and its substack size. The switch opening logic can receive substack position, die position, and substack size from the substrate (26) or from a die lower in the stack through bus (39) as part of or in conjunction with an instruction to open switches. Then the switch opening logic can carry out a process of opening switches by looking up its switch opening configuration with its substack position in stored data such as, for example, a storage arrangement like Table 2, and then opening the switches indicated by the "Switches To Open" column in the table. After the switch opening logic in a stack position opens its switches, the switch opening logic determines, by comparing its position in its substack with the number of dies in its substack, whether its die is the top die in a substack. If the switch opening logic is in a die whose die position in its substack is less than the size of the substack, then that switch opening logic is in a die that is not the top die in the substack. If the switch opening logic determines that its die is not the top die in a substack, the switch opening logic increments the value of the die position and sends the instruction to open switches, the substack position, and the incremented die position through bus (39) to the switch opening logic in the next higher die in the stack. If the switch opening logic determines that it's die is the top die in a substack, the switch opening logic increments the value of the substack position, resets the value of the die position in a substack to '1,' and sends the instruction to open switches, the incremented substack position, and the reset die position through bus (39) to the switch opening logic in the next higher die in the stack.

The switch opening logic in the top die in the overall stack can increment the substack position, reset the die position, and transmit the instruction to open switches upward through bus (39), despite the fact the instruction to open switches will have no effect when issued from the top die, exercising the algorithm because it must if all the dies are to be manufactured as identical. Alternatively, bus (39), in addition to the instruction to open switches, the substack position, and the die position can also carry an indication of the number of substacks in the stack, so that the switch opening algorithm in the switch opening logic in each die identically also retrieves its switch opening configuration, opens the switches, determines whether it's die in the top dies in a substack, compares the substack position to the number of substacks in the stack, and transmits information upward only if the value of the current substack position is less than the number of substacks in the stack. In this way, the switch opening logic in the top die in the overall stack would not try to transmit anything upward after opening its switches.

This specification just described two switch opening procedures or algorithms for die stacks with substacks, one that operates without knowing the number of substacks in the stack and another that operates in dependence upon the number of substacks in the stack. A third method of opening switches would be for switch opening logic in each die to increment the substack position before retrieving a switch configuration, opening switches, and passing values and instructions to the next die in the stack. In such a method, the source of the instruction to open switches and the first value of the substack position is configured to provide to the first die in the stack the initial value of the substack position as '0'. Methods of switch opening that first increment substack position can be adapted to operate with or without the parameter of the number of substacks in the stack, so that this specification now discloses four methods of switch opening. In addition, in implementations of die stacks that may be installed in environments likely to instruct the die stack to open switches every time a die stack is powered on, a switch opening procedure can include the steps of sensing whether switches have already been open and determining whether to open switches in dependence upon whether the switches have already been open, with or without the parameter of the number of substacks in the stack, thereby bringing this specification's count of methods of switch opening in substacks up to six. It is likely that persons of skill in the art will think of other procedures for opening switches in die stacks with substacks, and all such procedures are well within the scope of the present invention.

Figure 6:
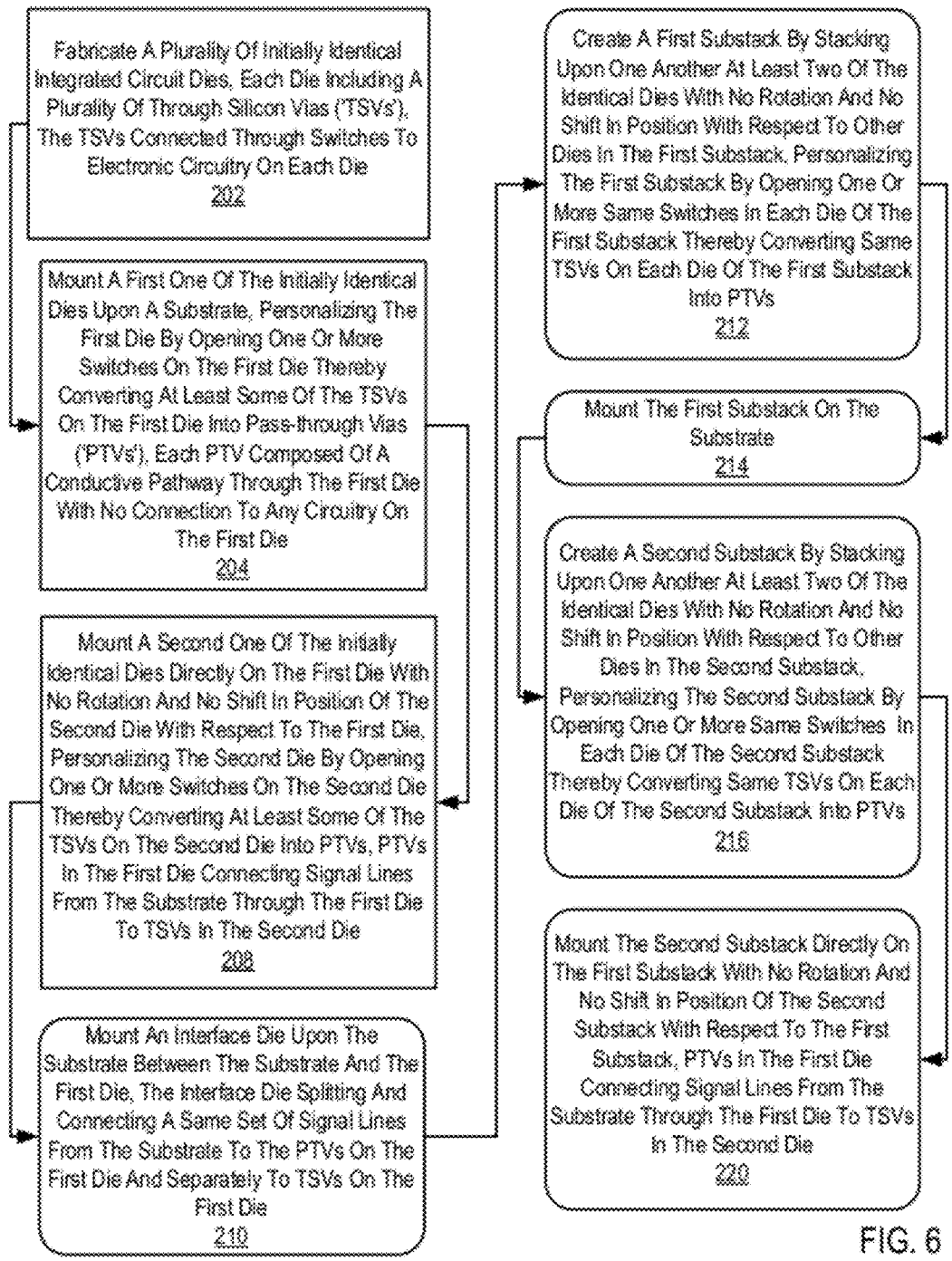
FIG. 6 sets forth a flow chart illustrating an example method of manufacturing an integrated circuit die stack according to embodiments of the present invention.

For further explanation, FIG. 6 sets forth a flow chart illustrating an example method of manufacturing an integrated circuit die stack according to embodiments of the present invention. The method of FIG. 6 fabricates integrated circuit die stacks like those described above with regard to FIGS. 1-5. For ease of explanation, therefore, the method of FIG. 6 is described here with reference to FIGS. 1-5 as well as FIG. 6, so that reference numbers in the discussion below are found not only on FIG. 6, but also on FIGS. 1-5.

The method of FIG. 6 includes fabricating (202) a plurality of initially identical integrated circuit dies (21, 22, 23), each die including a plurality of through TSVs, with the TSVs connected through switches to electronic circuitry on each die. As initially manufactured, all of the vertical conductive signal paths (28, 29, 30) through the dies (21, 22, 23) are TSVs—that is, all the switches (33) are manufactured so that they are closed when initially powered on. The method of FIG. 6 also includes mounting (204) a first one of the initially identical dies (21) upon a substrate (26), personalizing the first die by opening one or more switches (33) on the first die thereby converting at least some of the TSVs on the first die into PTVs (29, 30), with each PTV implementing a conductive pathway through the first die with no connection to any circuitry on the first die. Personalizing the first die is carried out at least when power is first applied to the first die.

The method of FIG. 6 also includes mounting (208) a second one of the initially identical dies (22) directly on the first die (21) with no rotation and no shift in position of the second die with respect to the first die, and personalizing the second die, at least when power is first applied to the second die, by opening one or more switches (33) on the second die thereby converting at least some of the TSVs on the second die into PTVs (28, 30), with the PTVs (29) in the first die connecting signal lines (48b, 51) from the substrate (26) through the first die (21) to TSVs (29) in the second die (22). The example die stacks described above with regard to FIGS. 2-4 each has a third die (23) in the die stack (20), but readers will recognize that including a third die in a die stack according to embodiments of the present invention, or indeed a fourth or fifth die, or any number of dies as will occur to those of skill in the art, is merely a matter of repeating the steps of the method of FIG. 6.

The method of FIG. 6 also includes mounting (210) an interface die (62 on FIGS. 3-4) upon the substrate (26) between the substrate and the first die (21), with the interface die (62) splitting and connecting a same set of signal lines (48) from the substrate (26) to the PTVs (29, 30) on the first die (21) and separately to TSVs (28) on the first die (21). As an alternative to a direct split of the signal lines, reference (64) on FIG. 3, the interface die can be configured to multiplex and demultiplex, reference (76) on FIG. 4, signal lines (48) from the substrate (26) to the PTVs (29, 30) on the first die (21) and separately to TSVs (28) on the first die (21), with the signal lines in the substrate (48), to the PTVs (70), and to the TSVs (68) all operating at a same clock speed. As a further alternative, the interface die (62 on FIG. 4) can be configured to multiplex and demultiplex, reference (76) on FIG. 4, signal lines (48) from the substrate with the signal lines (48) in the substrate operating at a first clock speed (63) and the interface die operating the signal lines to the PTVs (70) and to the TSVs (68) at a second clock speed (67 on FIG. 4), with the first clock speed sufficiently faster than the second clock speed to fit onto the signal lines (68, 70) of the interface die all communications between the substrate and the PTVs and the TSVs. Mounting (210) an interface die between the substrate and the first die in the die stack is depicted as an optional step in the flow chart of FIG. 6, because die stacks according to embodiments of the present invention may be fabricated with or without interface dies.

With reference to both FIG. 6 and also to FIG. 5: The method of FIG. 6 also includes creating (212) a first substack (78) by stacking upon one another at least two of the identical dies (21, 22) with no rotation and no shift in position with respect to other dies in the first substack, personalizing the first substack by opening one or more same switches (33) in each die of the first substack thereby converting same TSVs on each die of the first substack into PTVs (29, 30). Some TSVs are left TSVs (28) in the first substack (78) with connections (41) through switches (33) to electronic circuitry (36) in the first substack. The method of FIG. 6 also includes mounting (214) the first substack upon the substrate (26).

The method of FIG. 6 also includes creating (216) a second substack (80) by stacking upon one another at least two of the identical dies (23, 24) with no rotation and no shift in position with respect to other dies in the second substack, personalizing the second substack by opening one or more same switches (33) in each die (23, 24) of the second substack (80) thereby converting some TSVs on each die of the second substack into PTVs (28, 30). Similarly as was done for the first substack, some TSVs are left TSVs (29) in the second substack (80) with connections (41) through switches (33) to electronic circuitry (36) in the second substack. The method of FIG. 6 also includes mounting (220) the second substack (80) directly on the first substack (78) with no rotation and no shift in position of the second substack with respect to the first substack, so that PTVs (29) in the first substack connect signal lines (48b, 51) from the substrate (26) through the first substack (78) to TSVs (29) in the second substack (80).

Steps (212, 214, 216, 220) are depicted in the flow chart of FIG. 6 as optional because die stacks according to embodiments of the present invention may be implemented with or without substacks. A die stack containing only single, disparately personalized dies, as in the die stack of FIG. 2, contains no substacks—it being taken as trivial here to speak of a 'substack' as containing only one disparately personalized die. That is, a 'substack' as the term is used here contains at least two dies, identical in every way, identical in initial manufacture and identical in personalization by switch opening, and stacked with no rotation and no shift in position with respect to one another.

For further explanation, FIG. 7 sets forth a flow chart illustrating an example method of operation for an integrated circuit die stack (20) according to embodiments of the present invention. The method of FIG. 7 operates integrated circuit die stacks like those described above with regard to FIGS. 1-5. For ease of explanation, therefore, the method of FIG. 7 is described here with reference to FIGS. 1-5 as well as FIG. 7, so that reference numbers in the discussion below are found not only on FIG. 7, but also on FIGS. 1-5.

With reference both to FIG. 7 and also to FIG. 2: The method of FIG. 7 includes transmitting (302) an alternating current signal (63) from a substrate (26) through a first die (21) of a die stack (20) to electronic circuitry (36) in a second die (22) of the die stack, where the first die (21) is mounted directly upon the substrate (26) and manufactured to be initially identical to the second die with a plurality of through TSVs. As initially manufactured, all of the vertical conductive signal paths (28, 29, 30) through the dies (21, 22, 23) are TSVs. All the TSVs are initially connected through switches (33, 34, 1, 2, 3) to electronic circuitry on each die, because all switches (33) are manufactured to be closed when power is first applied to a die, and the first die is later personalized, at least when power is first applied, by opening on the first die one or more of the switches, thereby converting the TSVs previously connected to closed switches into PTVs. Each PTV implements a conductive pathway through a die with no connection to any circuitry on the die, and the second die (22) is mounted upon the first die (21) with no rotation and no shift in position with respect to the first die so that PTVs (29) in the first die connect signal lines (48b, 51) from the substrate (26) through the first die (21) to TSVs (29) in the second die (22).

The method of FIG. 7 also includes conducting (304), by the first die (21), the signal (63) through PTVs (29) in the first die to TSVs (29) in the second die (22), and conducting (306), by the second die (22), the signal (63) through TSVs (29) in the second die (22) to the electronic circuitry (36) on the second die. The second die (22) was manufactured to be initially identical to the first die (21) and later personalized by opening switches (33) connecting TSVs to circuitry on the second die.

With reference both to FIG. 7 and also to FIGS. 3-4: The method of FIG. 7 also includes conducting (308) the signal (63) through an interface die (62) mounted upon the substrate (26) between the substrate and the first die (21), where the interface die splits and connects (68, 70) a same set of signal lines (48, 52) from the substrate to the PTVs (29, 30) on the first die (21) and separately to TSVs (28) on the first die (21). The splitting of signals in the interface die (62) can be carried out by interface circuitry (64) in the interface die (62)—of the kind illustrated and described above with reference to FIG. 3.

The method of FIG. 7 also includes the alternative option of multiplexing and demultiplexing (310) by the interface die (26) the same set of signal lines (48, 52) from the substrate (26) to the PTVs (29, 30) on the first die (21) and separately to TSVs (28) on the first die (21), with the signal lines on the substrate (48, 52), to the PTVs (70), and to the TSVs (68) all operating at a same clock speed. The multiplexing and demultiplexing of signals in the interface die (62) can be carried out by mux/demux circuitry (76) in the interface die (62)—of the kind illustrated and described above with reference to FIG. 4.

As a further optional alternative, the method of FIG. 7 also includes multiplexing and demultiplexing (312) by the interface die (26) the same set of signal lines (48) from the substrate (26) to the PTVs (28) on the first die (21) and separately to TSVs (30) on the first die (21), including operating by the substrate (26) the signal lines (48) on the substrate (26) at a first clock speed (63) and operating by the interface die signal lines (68, 70) to the PTVs (28, 29) and to the TSVs (30) at a second clock speed (67), where the first clock speed is sufficiently faster than the second clock speed to fit onto the signal lines (68, 70) of the interface die (62) all communications between the substrate (26) and the PTVs (28, 29) and the TSVs (30). The steps of conducting (308) the signal through an interface die as well multiplexing and demultiplexing (310, 312) the signal by the interface die are depicted as optional steps in the flow chart of FIG. 7, because die stacks according to embodiments of the present invention may be operated with or without interface dies.

For further explanation, FIG. 8 sets forth a flow chart illustrating a further example method of operation for an integrated circuit die stack according to embodiments of the present invention. The method of FIG. 8 operates integrated circuit die stacks including substacks like those described above with regard to FIG. 5. For ease of explanation, therefore, the method of FIG. 8 is described here with reference to FIG. 5 as well as FIG. 8, so that reference numbers in the discussion below are found not only on FIG. 8, but also on FIG. 5. The method of FIG. 8 is similar to the method of FIG. 7, including as it does transmitting (302) an alternating current signal from a substrate, conducting (304) the signal through PTVs, and conducting (306) the signal through TSVs to electronic circuitry.

In the method of FIG. 8, however, transmitting (302) an alternating current signal (63) from a substrate (26) includes transmitting (314) the signal through a first substack (78) of the die stack (20) to electronic circuitry (36) in a second substack (80) of the die stack. The first die substack (78) is mounted upon the substrate (26), and the first substack is composed of two or more dies (21, 22) manufactured to be initially identical to dies in the second die substack (80) with a number of TSVs. Each of the dies (21, 22) in the first substack (78) is stacked directly upon one another with no rotation and no shift in position with respect to one another. Each vertical conductive pathway (28, 29, 30) through a die (21, 22, 23, 24) in the stack (20) is initially manufactured as a TSV, that is, connected (41) to circuitry (36) on a die through switches (33). The dies of the first substack are then later personalized by opening on the dies of the first substack a number of same switches (33) in each die of the first substack, thereby converting the TSVs previously connected through the open switches into PTVs (29, 30), each PTV implementing a conductive pathway through a die with no connection to any circuitry on the die.

Also in the method of FIG. 8, conducting (304) the signal (63) through PTVs includes conducting (316), by the first die stack (78), the signal (63) through PTVs (29) of the first die substack (78) to TSVs (29) in the second die substack, and conducting (306) the signal (63) through TSVs includes conducting (318), by the second substack (80), the signals (63) through TSVs (29) of the second substack (80) to the electronic circuitry (36) in the second substack, where the second substack (80) includes dies (23, 24) manufactured to be initially identical to the dies (21, 22) of the first substack (78) and later personalized by opening same switches (33) in each of the dies of the second substack. "Same switches" refers to opening the same switches in each die within a substack. The exact pattern or subset of the switches open differs across substacks. The switches open in the first substack (78) are not exactly the same subset of the switches that are open in the second substack (80). Within a substack, among the dies of a substack, the same switches are open. Each of the dies (23, 24) in the second substack (80) are stacked directly upon one another with no rotation and no shift in position with respect to one another, and the second substack is mounted upon the first substack so that the PTVs (29) in the first substack (78) connect conductors (48b, 51) from the substrate (26) through the first substack (78) to TSVs (29) in the second substack (80).

In view of the explanations set forth above, readers will recognize that the benefits of integrated circuit die stack having initially identical dies personalized with switches according to embodiments of the present invention include:

Substantial reduction of bus signal line loads when stacking multiple dies, hence easier impedance matching and better control of bus noise, Higher signal quality on the vias in the dies of a stack, Support for faster bus speeds on the vias in the dies of a stack, Flexible support for bus structures completely internal to the die stack, with no requirement whatsoever for external wiring to connect signals, common, or power up through the stack, and Flexible support for multiple different bus structures in a single die stack, despite the fact that all the dies in a die stack, with the optional exception of an interface die, are initially identical.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An integrated circuit die stack comprising:

a first die mounted upon a substrate, the first die manufactured to be initially identical to a second die with a plurality of through silicon vias ('TSVs'), the TSVs connected through switches to electronic circuitry on the first die, the first die personalized by opening on the first die one or more of the switches, converting the TSVs previously connected through the open switches into pass-through vias ('PTVs'), each PTV comprising a conductive pathway through the first die with no connection to any circuitry on the first die;

the second die, manufactured to be initially identical to the first die and later personalized by opening switches connecting TSVs to circuitry on the second die, the second die mounted upon the first die so that the PTVs in the first die connect signal lines from the substrate through the first die to TSVs in the second die, each TSV on the second die comprising a conductive pathway through the second die that is also connected to electronic circuitry on the second die;

a first die substack mounted upon the substrate, the first substack comprising two or more dies manufactured to be initially identical to dies in a second die substack with TSVs, the TSVs connected through switches to electronic circuitry on each of the dies of the first substack, the dies of the first substack personalized by opening on the dies of the first substack a number of same switches in each die of the first substack, converting the TSVs previously connected through the open switches into PTVs, each of the dies in the first substack stacked directly upon one another with no rotation and no shift in position with respect to one another; and the second substack, the second substack comprising dies manufactured to be initially identical to the dies of the first substack and later personalized by opening same switches in the dies of the second substack, each of the dies in the second substack stacked directly upon one another with no rotation and no shift in position with respect to one another, the second substack mounted upon the first substack so that the PTVs in the first substack connect conductors from the substrate through the first substack to TSVs in the second substack.

2. The die stack of claim 1 wherein the substrate comprises a plurality of conductors connected to conductive pathways in the dies, the conductors including power lines, common lines, and the signal lines.

3. The die stack of claim 1 further comprising:
an interface die mounted upon the substrate between the substrate and the first die splitting and connecting a same set of signal lines from the substrate to the PTVs on the first die and separately to TSVs on the first die.

4. The die stack of claim 1 further comprising:
an interface die multiplexing and demultiplexing the same set of signal lines from the substrate to the PTVs on the first die and separately to TSVs on the first die, the signal lines on the substrate, to the PTVs, and to the TSVs all operating at a same clock speed.

5. The die stack of claim 1 further comprising:
an interface die mounted upon the substrate between the substrate and the first die in the dies stack, the interface die multiplexing and demultiplexing a same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

6. A method of manufacturing an integrated circuit die stack comprising:
fabricating a plurality of initially identical integrated circuit dies, each die including a plurality of TSVs, the TSVs connected through switches to electronic circuitry on each die;
mounting a first one of the initially identical dies upon a substrate, personalizing the first die by opening one or more switches on the first die thereby converting at least some of the TSVs on the first die into PTVs, each PTV comprising a conductive pathway through the first die with no connection to any circuitry on the first die;
mounting a second one of the initially identical dies directly on the first die with no rotation and no shift in position of the second die with respect to the first die, personalizing the second die by opening one or more switches on the second die thereby converting at least some of the TSVs on the second die into PTVs, PTVs in the first die connecting signal lines from the substrate through the first die to TSVs in the second die;
creating a first substack by stacking upon one another at least two of the identical dies with no rotation and no shift in position with respect to other dies in the first substack, personalizing the first substack by opening one or more same switches in each die of the first substack thereby converting same TSVs on each die of the first substack into PTVs;
mounting the first substack on the substrate;
creating a second substack by stacking upon one another at least two of the identical dies with no rotation and no shift in position with respect to other dies in the second substack, personalizing the second substack by opening one or more same switches in each die of the second substack thereby converting some TSVs on each die of the second substack into PTVs; and
mounting the second substack directly on the first substack with no rotation and no shift in position of the second substack with respect to the first substack, PTVs in the first substack connecting signal lines from the substrate through the first substack to TSVs in the second substack.

7. The method of claim 6 wherein the substrate comprises a plurality of conductors connected to conductive pathways in the dies, the conductors including power lines, common lines, and the signal lines.

8. The method of claim 6 further comprising:
mounting an interface die upon the substrate between the substrate and the first die, the interface die splitting and connecting a same set of signal lines from the substrate to the PTVs on the first die and separately to TSVs on the first die.

9. The method of claim 6 further comprising:
mounting an interface die upon the substrate between the substrate and the first die, the interface die multiplexing and demultiplexing a same set of signal lines from the substrate to the PTVs on the first die and separately to TSVs on the first die, the signal lines on the substrate, to the PTVs, and to the TSVs all operating at a same clock speed.

10. The method of claim 6 further comprising:
mounting an interface die upon the substrate between the substrate and the first die, the interface die multiplexing and demultiplexing a same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

11. A method of operation for an integrated circuit die stack comprising:
transmitting an alternating current signal from a substrate through a first die of the die stack to electronic circuitry in a second die of the die stack, the first die mounted directly upon the substrate, the first die manufactured to be initially identical to the second die with a plurality of through silicon vias TSVs, the TSVs connected through switches to electronic circuitry on each die, the first die personalized by opening on the first die one or more of the switches, converting the TSVs previously connected to open switches into PTVs, each PTV comprising a conductive pathway through a die with no connection to any circuitry on the die, the second die mounted upon the first die with no rotation and no shift in position with respect to the first die so that PTVs in the first die connect signal lines from the substrate through the first die to TSVs in the second die;
conducting, by the first die, the signal through PTVs in the first die to TSVs in the second die;
conducting, by the second die, the signal through TSVs in the second die to the electronic circuitry on the second die, the second die manufactured to be initially identical to the first die and later personalized by opening switches connecting TSVs to circuitry on the second die;
transmitting an alternating current signal from a substrate further comprises transmitting the signal through a first substack of the die stack to electronic circuitry in a second substack of the die stack, the first die substack mounted upon the substrate, the first substack comprising two or more dies manufactured to be initially identical to dies in a second die substack with a number of TSVs, the TSVs connected through switches to a same circuit on each of the dies of the first substack, the dies of the first substack personalized by opening on the dies of the first substack a number of same switches in each die of the first substack, converting the TSVs previously connected through the open switches into PTVs, each PTV comprising a conductive pathway through a die with no connection to any circuitry on the die, each of the dies in the first substack stacked directly upon one another with no rotation and no shift in position with respect to one another; and conducting the signal through PTVs further comprises conducting, by the first die substack, the signal through PTVs of the first die substack to TSVs in the second die substack; and conducting the signal through TSVs further comprises conducting, by the second substack, the signals through TSVs of the second substack to the electronic circuitry in the second substack, the second substack comprising dies manufactured to be initially identical to the dies of the first substack and later personalized by opening same switches in each of the dies of the second substack, each of the dies in the second substack stacked directly upon one another with no rotation and no shift in position with respect to one another, the second substack mounted upon the first substack so that the PTVs in the first substack connect conductors from the substrate through the first substack to TSVs in the second substack.

12. The method of claim 11 wherein the substrate comprises a plurality of conductors connected to conductive pathways in the dies, the conductors including power lines, common lines, and the signal lines.

13. The method of claim 11 further comprising:
conducting the signal through an interface die mounted upon the substrate between the substrate and the first die, the interface die splitting and connecting a same set of signal lines from the substrate to the PTVs on the first die and separately to TSVs on the first die.

14. The method of claim 11 further comprising:
conducting the signal through an interface die mounted upon the substrate between the substrate and the first die, including multiplexing and demultiplexing by the interface die the same set of signal lines from the substrate to the PTVs on the first die and separately to TSVs on the first die, the signal lines on the substrate, to the PTVs, and to the TSVs all operating at a same clock speed.

15. The method of claim 11 further comprising:
conducting the signal through an interface die mounted upon the substrate between the substrate and the first die, including multiplexing and demultiplexing by the interface die the same set of signal lines from the substrate to the PTVs on the first die and separately to TSVs on the first die, the substrate operating the signal lines on the substrate at a first clock speed and the interface die operating the signal lines to the PTVs and to the TSVs at a second clock speed, the first clock speed sufficiently faster than the second clock speed to fit onto the signal lines of the interface die all communications between the substrate and the PTVs and the TSVs.

\* \* \* \* \*